(12) United States Patent
Zettl et al.

(10) Patent No.: US 7,674,389 B2
(45) Date of Patent: Mar. 9, 2010

(54) PRECISION SHAPE MODIFICATION OF NANODEVICES WITH A LOW-ENERGY ELECTRON BEAM

(75) Inventors: Alex Zettl, Kensington, CA (US); Thomas David Yuzvinsky, Berkeley, CA (US); Adam Fennimore, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 1099 days.

(21) Appl. No.: 11/260,021

(22) Filed: Oct. 26, 2005

(65) Prior Publication Data
US 2006/0228287 A1 Oct. 12, 2006

Related U.S. Application Data

(60) Provisional application No. 60/622,445, filed on Oct. 26, 2004.

(51) Int. Cl.
*H01L 21/302* (2006.01)
*B23K 15/00* (2006.01)
*B82B 3/00* (2006.01)

(52) U.S. Cl. ............... 216/2; 216/58; 216/63; 216/74; 216/81; 219/121.2; 438/689; 977/856; 977/888; 977/900

(58) Field of Classification Search ............ 216/2
See application file for complete search history.

(56) References Cited

U.S. PATENT DOCUMENTS 5,055,696 A * 10/1991 Haraichi et al. .......... 250/492.2

5,683,547 A * 11/1997 Azuma et al. ............... 438/695

(Continued)

FOREIGN PATENT DOCUMENTS

JP 2003012313 A * 1/2003

(Continued)

OTHER PUBLICATIONS

Suzuki, S et al, Japanese Journal of Applied Physics, "Low-Acceleration Voltage Electron Irradiation Damage in Single-Walled Carbon Nanotubes" 43 (8B) L1118-L1120, Jul. 30, 2004.*

(Continued)

*Primary Examiner*—Anita K Alanko
(74) *Attorney, Agent, or Firm*—Michael J. O'Connell; Robin C. Chiang; Lawrence Berkeley National Laboratory

(57) ABSTRACT

Methods of shape modifying a nanodevice by contacting it with a low-energy focused electron beam are disclosed here. In one embodiment, a nanodevice may be permanently reformed to a different geometry through an application of a deforming force and a low-energy focused electron beam. With the addition of an assist gas, material may be removed from the nanodevice through application of the low-energy focused electron beam. The independent methods of shape modification and material removal may be used either individually or simultaneously. Precision cuts with accuracies as high as 10 nm may be achieved through the use of precision low-energy Scanning Electron Microscope scan beams. These methods may be used in an automated system to produce nanodevices of very precise dimensions. These methods may be used to produce nanodevices of carbon-based, silicon-based, or other compositions by varying the assist gas.

17 Claims, 4 Drawing Sheets

U.S. PATENT DOCUMENTS

| | | | |
|---|---|---|---|
| 6,709,566 B2 * | 3/2004 | Cumings et al. | 205/641 |
| 6,777,637 B2 * | 8/2004 | Nakayama et al. | 219/68 |
| 6,780,075 B2 * | 8/2004 | Okamoto et al. | 445/50 |
| 7,052,666 B2 * | 5/2006 | Colbert et al. | 423/447.1 |
| 7,435,353 B2 * | 10/2008 | Golovchenko et al. | 216/41 |
| 7,452,477 B2 * | 11/2008 | Koops et al. | 216/62 |
| 2004/0033425 A1 * | 2/2004 | Koops et al. | 430/5 |
| 2004/0173759 A1 * | 9/2004 | Koops et al. | 250/428 |
| 2006/0205109 A1 * | 9/2006 | Cox et al. | 438/99 |
| 2008/0099674 A1 * | 5/2008 | Bihr et al. | 250/307 |

FOREIGN PATENT DOCUMENTS

| | | | |
|---|---|---|---|
| JP | 2003159700 A | * | 6/2003 |
| JP | 2004058194 A | * | 2/2004 |
| JP | 2006272374 A | * | 10/2006 |
| JP | 2008019153 A | * | 1/2008 |
| WO | WO 2007005731 A2 | * | 1/2007 |
| WO | WO 2008060680 A2 | * | 5/2008 |

OTHER PUBLICATIONS

Tran, M. Q. et al, Carbon, "Thermal oxidative cutting of multi-walled carbon nanotubes" 45, 2341-2350, Aug. 1, 2007.*

Liu, P. et al, Appl Phys Letters, "Cutting of carbon nanotubes assisted with oxygen gas inside a scannign electron microscope" 89, 113104, Sep. 11, 2006.*

Liu, P. et al, Proceedigns of the 2nd IEEE Intl Conf on Nano/Micro Engred and Molecular Sys, "Peeling and Cutting a Multi-Walled Carbon Nanotube inside a Scannign Electron Microscope", Jan. 16-19, 2007.*

Iijima , "Helical Microtubules of Graphitic Carbon," Nature Publishing Group, vol. 354, p. 56-58, (Nov. 7, 1991).

Dai et al., "Nanotubes as Nanoprobes in Scanning Probe Microscopy," Nature Publishing Group, vol. 384, p. 147-150, (Nov. 14, 1996).

Fennimore et al., "Rotational Actuators Based on Carbon Nanotubes," Nature Publishing Group, vol. 424, p. 408-410, (Jul. 24, 2003).

Tsang et al., "A Simple Chemical Method of Opening and Filling Carbon Nanotubes," Nature Publishing Group, vol. 372, p. 159-162, (Nov. 10, 1994).

Cumings et al., "Peeling and Sharpening Multiwall Nanotubes," Nature Publishing Group, vol. 406, p. 586, (Aug. 10, 2000).

Li et al., "The Engineering of Hot Carbon Nanotubes with a Focused Electron Beam," Nano Letters, vol. 4 ( No. 6), p. 1143-1146, Mar. 20, 2004.

Rubio et al., "A Mechanism for Cutting Carbon Nanotubes with a Scanning Tunneling Microscope," European Physical Journal B, vol. 17, p. 301-308, (Apr. 6, 2000).

Park et al., "Electrical Cutting and Nicking of Carbon Nanotubes using an Atomic Force Microscope," Applied Physics Letters, vol. 80 ( No. 23), p. 4446-4448, (Jun. 10, 2002).

Collins et al., "Engineering Carbon Nanotubes and Nanotube Circuits Using Electrical Breakdown," Science Magazine, vol. 292, p. 706-709, (Apr. 27, 2001).

Smith et al., "Electron Irradiation Effects in Single Wall Carbon Nanotubes," Journal of Applied Physics, vol. 90 ( No. 7), p. 3509-3515, (Oct. 1, 2001).

Marti et al., "Structure and Dynamics of Liquid Water Adsorbed on the External Walls of Carbon Nanotubes," Journal of Chemical Physics, vol. 119 ( No. 23), p. 12540-12546, (Dec. 15, 2003).

Banhart et al., "The Formation, Annealing and Self-Compression of Carbon Onions under Electron Irradiation," Chemical Physics Letters, vol. 269, p. 349-355, (Feb. 24, 1997).

Schutten et al., "Gross- and Partial-Ionization Cross Sections for Electrons on Water Vapor in the Energy Rangy 0.1-20 ke V," Journal of Chemical Physics, vol. 44 ( No. 10), p. 3924-3928, (May 15, 1966).

Yuzvinsky et al., "Precision Cutting of Nanotubes with a Low-Energy Electron Beam," Applied Physicis Letters, vol. 86, p. 053109-1-053109-3, (2005). Jan. 31, 2005.

Jansen et al., "A Survey on the Reactive Ion Etching of Silicon in Microtechnology," Journal of Micromechanics and Microengineering, vol. 6 ( No. 1), p. 14-28, (Mar. 1996).

Peng et al., "Coulomb Blockade in Suspended Si3N4-Coated Single-Walled Carbon Nanotubes," Applied Physics Letters, vol. 84 ( No. 26), p. 5428-5430, (Jun. 28, 2004).

Collins et al., "Nanotubes for Electronics," Scientific American, p. 62-69, (Dec. 2000).

Kolar et al., "Observation of Moving Dislocation Kinks and Unpinning," Physicial Review Letters, vol. 77 ( No. 19), p. 4031-4034, (Nov. 4, 1996).

Shelimov et al., "Purification of Single-Wall Carbon Nanotubes by Ultrasonically Assisted Filtration," Chemical Physics Letters, vol. 282, p. 429-434, (Jan. 23, 1998).

Steele, "CU Physicists Cut Nanotubes and Count Electrons with Atomic Force Microscope," Cornell Chronicle, p. 8 (Aug. 30, 2001).

Chopra et al., "Boron Nitride Nanotubes," Science Magazine, vol. 269 ( No. 522), p. 966-967, (Aug. 18, 1995).

Yuzvinsky et al., "Engineering Nanomotor Components from Multi-Walled Carbon Nanotubes via Reactive Ion Etching" Electronic Properties of Synthetic Nanostructures, AIP Conference Proceedings, vol. 723, p. 512-515, (2004).

Goldstein et al., "Sample Preparation for Biological, Organic, Polymeric, and Hydrated Materials," Scanning Electron Microscopy and X-Ray Microanalysis, Plenum Press, Chapter 12, p. 571-670, (1992).

Heide, "Contamination and Irradiation Effects and Their Dependence on the Composition of Residual Gases in the Electron Microscope," Laboratory Investigation, vol. 14, (No. 6) p. 396-401, (1965).

Joy et al., "Resin Based Standards for Biological Energy Dispersive X-Ray and Electron Energy Loss Microanalysis," Electron Probe Microanalysis: Applications in Biology and Medicine, Springer, Berlin, DE p. 127-136, (1989).

Talmon et al., "Mass Loss and Etching of Frozen Hydrated Specimens," Journal of Microscopy, vol. 117, (Pt 3) p. 321-332, (Dec. 1979).

Cox et al., "Bespoke Carbon Nanotube Devices and Structures," Nanoengineered Nanofibrous Materials, Kluwer Academic Publishers Chapter 4, p. 323-328 (2004).

* cited by examiner

PRECISION SHAPE MODIFICATION OF NANODEVICES WITH A LOW-ENERGY ELECTRON BEAM

CROSS-REFERENCE TO RELATED APPLICATIONS

This application claims benefit of priority to U.S. provisional patent application No. 60/622,445, filed on Oct. 26, 2004.

STATEMENT OF GOVERNMENTAL SUPPORT

This invention was made during work supported by U.S. Department of Energy under Contract No. DE-AC02-05CH11231. The government has certain rights in this invention.

REFERENCE TO SEQUENCE LISTING, TABLE, OR COMPUTER PROGRAM APPENDIX

None.

BACKGROUND OF THE INVENTION

Nanotubes (such as those formed from carbon[1] and boron-nitride[2]) are versatile nanoscale building blocks which have already been incorporated into a variety of useful devices. Although nanotubes are relatively easy to synthesize, at present it is difficult to control at the synthesis level the geometrical configurations, including length, number of walls, chirality, etc. Of great utility would be a method whereby the geometrical features of nanotubes could be shape altered post-synthesis, either before or after their incorporation into functional nanodevices.

A versatile method for cutting nanotubes would be particularly useful. Nanotube devices are often made by poorly controlled solution deposition or chemical growth techniques, which can easily lead to device components contacting multiple nanotubes where only one is desired. A method for removing excess nanotubes is therefore required. Other applications, such as carbon nanotube tipped atomic force microscopy (AFM) cantilevers[3], require that nanotubes be cut down to a certain length for optimum device performance. It may additionally be preferred that AFM tips be "sharpened" to provide even higher capabilities. Finally, certain nanotube-based systems, such as nanoscale rotational bearings, require nanotubes that have been selectively modified[4,5].

BRIEF SUMMARY OF THE INVENTION

In one embodiment, this invention discloses a method of shape modifying a nanodevice, comprising: a) providing a nanodevice; b) providing an assist gas; and c) contacting the nanodevice with a low-energy focused electron beam in the presence of the assist gas. An application of force may be made to at least a part of the nanodevice during the application of the low-energy focused electron beam, whereby the nanodevice is deflected into a shape-modified nanodevice. In this sense, a nanodevice may be considered partially plastic or thermoplastic in nature in the sense that it may be heated, deformed, and cooled in the substantially deformed geometric configuration.

The force applied to shape-modify a nanodevice may be comprised of one or more of a group consisting of: i) gravity; ii) electromagnetically induced force; iii) ponderomotive force; iv) mechanically induced force or torque; and v) laser tweezers force. The mechanically induced force or torque may be induced through direct application of force, such as that induced through the movement of an atomic force microscope (AFM) tip. Such AFM tips may have attached thereto carbon nanotubes acting as nano-scale force-inducing beams.

In another embodiment, the contacting with low-energy focused electron beam step is achieved by exposing the nanodevice to a scan beam from a scanning electron microscope. Blanking may or may not be used in the scan line operation. Additionally, an operator, or computer feedback controlled pattern recognition system, may be observing the nanodevice contacting the low-energy focused electron beam.

In another embodiment, the assist gas may comprise substantially one or more of a group consisting of: $O_2$, $O_3$, $H_2O$, $H_2O_2$, $N_2$, $H_2$, $CH_4$, $F_2$, $NF_3$, $SiF_4$, $CF_4$, $SF_6$, $Cl_2$, $Br_2$, and $CBr_4$.

It is believed that the most efficatious and highest speed material removal of carbon-based nanodevices occurs when the assist gas comprises substantially one or more of a group consisting of: $H^+$, $O^-$, and $OH^-$. Thus, basically any source chemical that supplies such radicals in contact with the carbon-based nanodevice would suffice to remove nanodevice material with the coincident application of a low-energy electron beam. Ideally, such material removal occurs with no subsequent deposition arising from reactions with the source chemical. Also, it is most ideal when the nanodevice material removal is due to a chemical reaction that produces gaseous byproducts.

Similarly, for doped and undoped silicon-based nanodevices, assist gases that produce halogen radicals $Br^-$, $F^-$, $Cl^-$ would appear to be very useful for material removal.

The assist gas partial pressure may be greater than one of a group of partial pressures consisting of: $10^{-5}$ Torr, $10^{-4}$ Torr, $10^{-3}$ Torr, $10^{-2}$ Torr, $10^{-1}$ Torr, 1 Torr, 10 Torr, 100 Torr, and 1000 Torr.

In the embodiments above, nanodevices may be comprised of one or more of a group consisting of: i) a single walled carbon nanotube; ii) a multiwalled carbon nanotube; iii) a carbon nanowire; iv) a carbon nanosheet; v) a carbon nanobelt; vi) a carbon nanotube bundle; vii) a boron-nitride nanotube; viii) a silicon nanotube; ix) a silicon nanobelt; x) a silicon nanowire; xi) a compositionally modulated silicon nanowire; and xii) a silicon nanomembrane. It is thought that the techniques taught herein may additionally be broadly useful for nanobelts of $SnO_2$ composition, as well as the various doped and undoped Fullerine structures.

In the methods discussed above, the low energy electron beam may be comprised of an electron beam with an energy of less than 100 keV, less than 86 keV, 10 keV or less, or 1 keV or less.

Using the methods described above, a shape-modified nanodevice product may be manufactured.

In another embodiment, a shape-modified nanodevice may be fabricated through steps comprising: an initial nanodevice modified by a means for shape-modifying the initial nanodevice into a shape-modified nanodevice. The means for shape-modifying may be accomplished in turn by steps comprising: i) providing an assist gas; ii) contacting the initial nanodevice with a low-energy focused electron beam in the presence of the assist gas, thereby selectively removing material from the initial nanodevice.

In another embodiment, a nanodevice may be shape modified by an additional step comprising: applying a force to at least a part of the initial nanodevice during an application of a low-energy focused electron beam, whereby the initial nanodevice is deflected into a shape-modified nanodevice. In this sense, it is believed that the energy supplied by the low-energy focused electron beam serves to disrupt atomic lattice structures in the nanodevice, allowing it to take on essentially a temporarily plastic nature. Thus, when a force is applied to the nanodevice, it may be deflected into a shape that, after sufficient low-energy focused electron beam exposure, becomes permanent when the deflection forces are removed.

In the method above, the applying a force step may be comprised of one or more of a group consisting of: i) gravity; ii) electromagnetically induced force; iii) ponderomotive force; iv) mechanical force or torque; and v) laser tweezers force. In the application of the force above, the magnitude of the force is of a sufficient magnitude so as to deform the initial nanodevice into a desired final configuration.

In addition to the plastic deformation described above, additional material may be selectively removed from the nanodevice through the use of the low-energy focused electron beam on the nanodevice with simultaneous exposure to an assist gas.

In still another embodiment, a method for shape-modifying a nanodevice may comprise: a) providing an initial nanodevice; and b) a means for shape-modifying said initial nanodevice into a shape-modified nanodevice.

In this embodiment, the means for shape-modifying may comprise: i) selectively removing material from the initial nanodevice. The selective removal of material may again be based on i) providing an assist gas; and ii) contacting the initial nanodevice with a low-energy focused electron beam in the presence of the assist gas, iii) whereby material from the initial nanodevice is selectively removed.

In the methods of shape-modifying a nanodevice above, the means for shape-modifying generally comprises: i) applying a low-energy focused electron beam to the initial nanodevice; and ii) applying a force to at least a part of the initial nanodevice during the application of the low-energy focused electron beam, whereby the initial nanodevice is deflected into a shape-modified nanodevice. Such shape-modification may be undertaken separately, or simultaneously, where the means for shape-modifying further comprises: i) providing an assist gas; and ii) contacting the initial nanodevice with the low-energy focused electron beam in the presence of the assist gas, iii) whereby material from the initial nanodevice is selectively removed.

DETAILED DESCRIPTION OF THE PREFERRED EMBODIMENT

Introduction

Figure 1A:
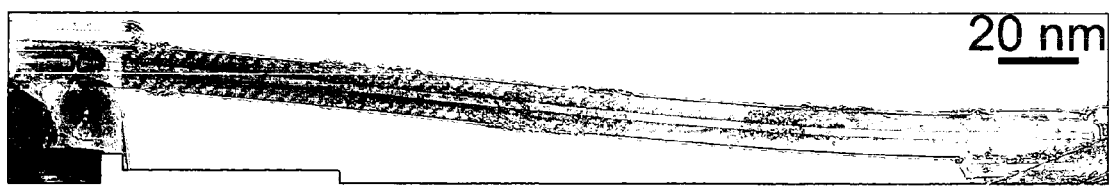
FIG. 1 is a set of composite Transmission Electron Microscopy (TEM) micrographs of (A) a nanotube in its pristine state suspended on a TEM grid, (B) the same nanotube after cutting, (C) a close-up image of the same nanotube, and (D) the cut segments of the nanotube, rotated and aligned to vertically correspond with the same sections in (C). The scale bars are 20 nm in FIGS. 1A and 1B, and 10 nm in FIGS. 1C and 1D.
Figure 1B:
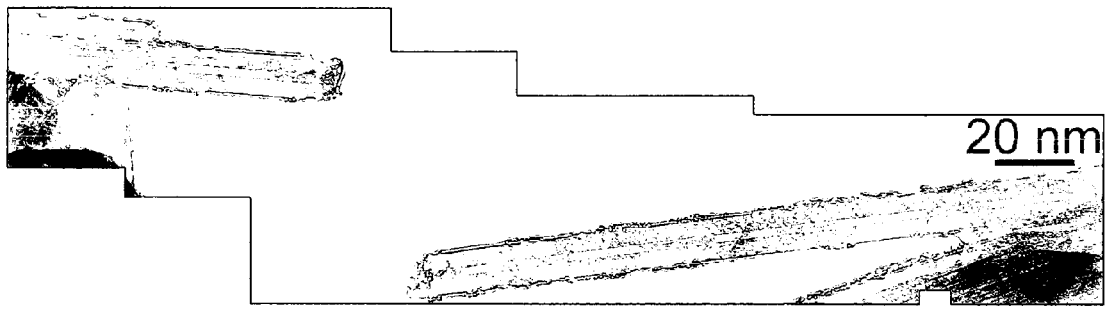
Figure 1C:
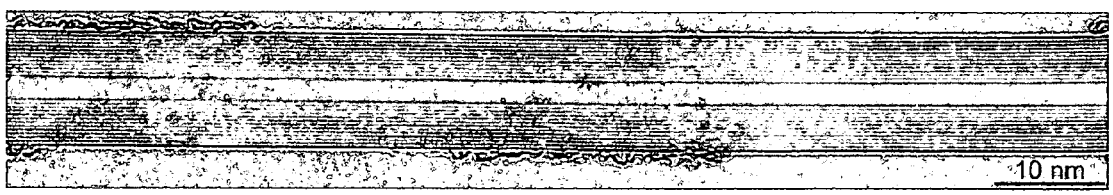
Figure 1D:

In one embodiment, the present invention contemplates a technique by which nanodevices are controllably shape modified using a low energy focused electron beam, typically originating from a scanning electron microscope (SEM). The present invention contemplates cutting through nanodevices, or, with smaller doses, partially cutting through a nanodevice to create hinge-like defects, for instance in semi-intact nanotubes. By extrapolation, is should be possible to additionally cut through and shape nanowires and nanosheets using the same methods expounded in this application. Examination of shape modified nanotubes in a TEM reveals that material is removed with minimal damage to surrounding areas. The present method is compatible with most device architectures (the nanodevice need only be viewable in an SEM), offers complete control over where the nanodevice will be cut, and is relatively fast, requiring only several minutes to load, locate and cut the nanodevice in the SEM.

Definitions

Nanodevices are devices that comprise one or more elements having a characteristic minimum dimension of less than or equal to 100 nm, and may be exemplified, without limitation, by components including one or more of: a single walled carbon nanotube; a multiwalled carbon nanotube; a carbon nanowire; a carbon nanosheet; a carbon nanobelt; a carbon nanotube bundle; a boron-nitride nanotube; a silicon nanotube; a silicon nanobelt; a silicon nanowire; a compositionally modulated silicon nanowire; and a silicon nanosheets. Some nanodevices act as nanomotors, nanomechanical resonators, nanobeam deflectors, sensors, actuators, device components, etc.

An assist gas is a moiety that reacts with a nanodevice upon application of energy, typically reacting with the nanodevices to produce a gaseous reaction product that departs from the nanodevices. The composition of an assist gas will depend on the composition of the nanodevices material to be removed. Typically, water and oxygen work well for carbon materials, as is believed any gas that decomposes into $H^+$ and/or $OH^-$ radicals. It is believed that alcohols and other organic solvents should also work as viable assist gases, although they may also deposit material simultaneously with nanodevice material removal due to their carbon content. It is believed that hydrogen peroxide and ozone should also work for carbon-based nanodevice material removal, and would likely be as clean an assist gas as water and oxygen have been in previous experiments. It is also believed that nitrous oxide, nitric oxide, nitrogen dioxide and perhaps ammonia or other nitrogen compounds would also work for carbon nanodevices material removal, with $N_2$ gas evolved as a harmless byproduct.

Low voltage electron beam refers to an electron beam with energies below that required to completely dislodge atomic constituents in a target nanodevice. In some instances in this application, such electron beam energies are expounded. For instance, for carbon-based nanodevices, a low voltage electron beam will be below about 86 keV, since 86 keV is the required minimum energy for carbon atom removal from carbon nanotubes without an assist gas.

Experimental Multiwall Carbon Nanotube Cutting

Multiwall carbon nanotubes synthesized by the standard arc-discharge technique were dispersed in either ortho-dichlorobenzene or isopropyl alcohol (no dependence upon the particular solvent used was seen). The nanotube solution was then deposited either onto TEM grids coated with lacey carbon for TEM imaging or onto a silicon oxide surface for in situ electrical transport studies. Electrical contacts were patterned by standard electron beam lithography and were comprised of gold over a thin chromium adhesion layer. The samples were then loaded for cutting into an FEI XL30 Sirion SEM. During cutting, the SEM was operated in line scan mode at maximum magnification ($10^6\times$), with the nanotube axis perpendicular to the scan line. Several different gasses were introduced through a leak valve, and partial gas pressures were measured with a Stanford Research Systems SRS200 residual gas analyzer. Absolute pressure was measured using a Bayard-Alpert ion gauge and a Terranova 934 controller programmed with the appropriate gas constants. A Keithley 2400 source meter was used for transport measurements. TEM images were taken before and after cutting in a JEOL 2010 TEM using an acceleration voltage of 100 keV.

It was found in this experimental setup that nanotube about 1 nm diameter could be cut to arbitrary lengths with 10 nm accuracies. When cutting multiwalled carbon nanotubes of 20 nm diameters, cutting kerfs were approximately 20 nm wide, and cutting accuracy would typically be within 50 nm.

The present invention contemplates geometric modification of nanodevices at a variety of acceleration voltages, beam currents, and gas pressures within a vacuum chamber. Typically, the acceleration voltage imparting an electron beam would be from a scanning electron microscope scan beam. However, an electron beam could originate from a non-SEM source. It is additionally expected that other precisely focused energy sources could suffice to activate nanodevices to react with an assist gas to result in selective material removal.

When cutting a carbon nanotube within the vacuum chamber of a SEM system, cuts were seen as a gradual decrease in height and width of the nanotube line scan profile, and the decrease accelerated as the cut neared completion. The present invention contemplates the interruption of any cut by blanking the beam or switching the microscope out of line scan mode. If the nanotube was suspended, as on a TEM grid, a region sufficiently treated with selective electron beam treatment and material removal would often act as a loose hinge, with the nanotube swinging under the charging influence of the electron beam. The present invention contemplates the ability to make oblique cuts by rotating the scan line relative to the nanotube, which may be useful for making sharpened AFM tips.

FIG. 1 shows a nanotube on a TEM grid before and after cutting. FIG. 1A shows the uncut nanotube suspended across a gap. The turbulent deposition method displaced the ends of the nanotube perpendicular to its longitudinal axis, subjecting it to a shear strain which was maintained by contact with the grid and other deposited material. This shear strain was released when the nanotube was cut, and the two sections of the nanotube straightened out, as seen in FIG. 1B. FIG. 1C is a close-up image of a section of the pristine nanotube before cutting. FIG. 1D shows the same section after cutting, with the two cut sections rotated and aligned to vertically correspond with FIG. 1C. A comparison of these last two images shows that the cut removed approximately 40 nm of material. Furthermore, the damage induced by the electron beam was confined to the immediate region of the cut, with equal damage done to each subsequent layer of the multiwall nanotube.

Figure 2:
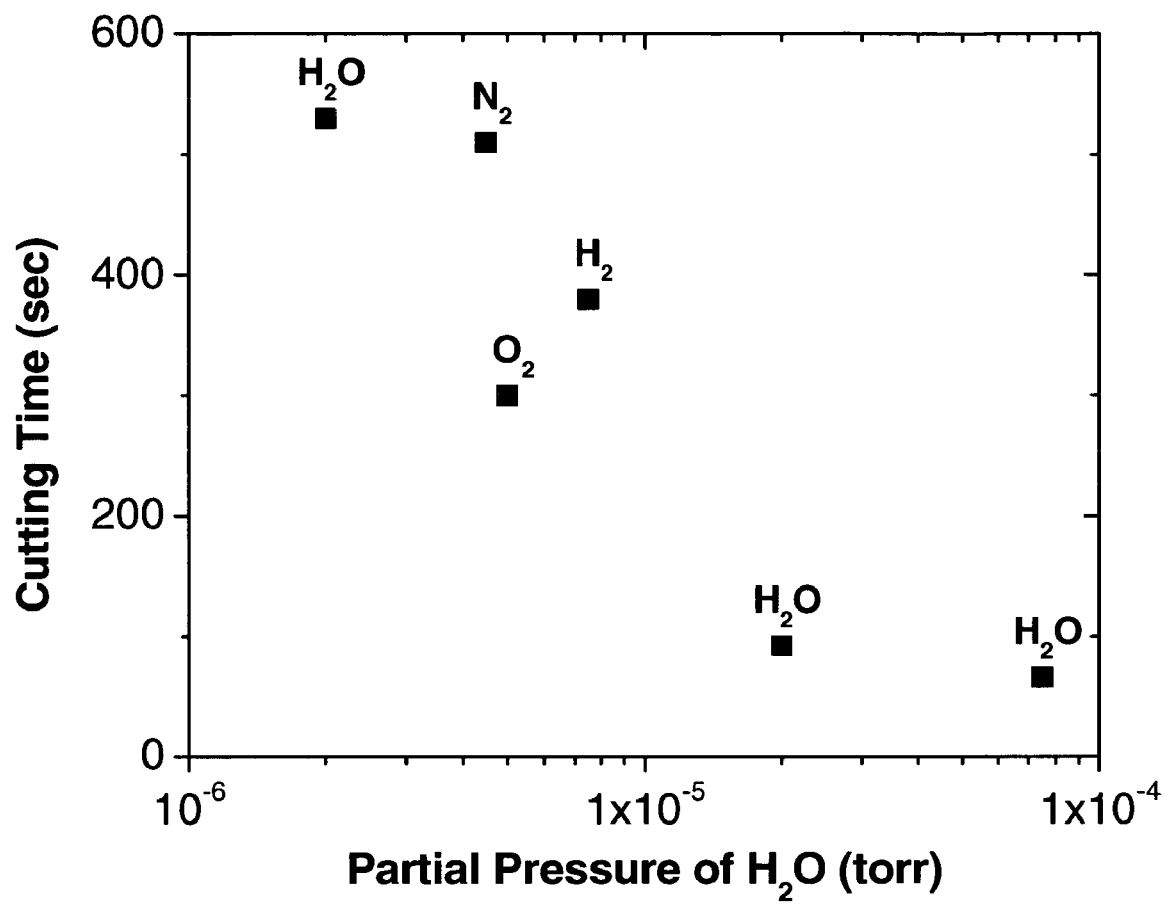
FIG. 2 is a plot of cutting times for multiple cuts on a single nanotube in different atmospheres. The partial pressure of water is shown on the horizontal axis, while the majority gas is shown above the data points. The total pressure was $7.5 \cdot 10^{-5}$ Torr during the $N_2$, $O_2$ and $H_2$ trials.

The most important factor affecting the cutting speed was the presence of water vapor within the chamber. FIG. 2 shows the results of cutting through a single nanotube at several points along its length in different atmospheres, with an acceleration voltage of 1 keV and a beam current of 118 pA. At total pressures below $2 \cdot 10^{-6}$ Torr, where most of the residual pressure was due to water vapor, nanotubes could be exposed to the beam for over 10 minutes and still not be visibly damaged. Bleeding in nitrogen to a pressure of $7.5 \cdot 10^{-5}$ Torr did not significantly affect the cutting time. Bleeding in hydrogen at the same pressure resulted in slightly faster cuts, but this may be due to a higher partial pressure of water (since our hydrogen source contained a partial pressure of water over 50% higher than in the other gasses tested). Oxygen consistently increased cutting speed up to twice as fast as with no assist gas. Water, at the same pressure, would increase the cutting speed even more, up to ten times as fast as with no assist gas.

Electron beam induced mass loss is a well known effect in electron microscopy of biological samples[6]. Studies have found that a common source of mass loss is caused by the presence of water[7,8]. Radiolysis of water molecules is the driving force behind this etching mechanism[9], as highly reactive OH., H., and $HO_2$. radicals can react with carbon atoms to form CO, $CO_2$, various hydrocarbons and hydrogen gas, leading to mass loss of the original carbonaceous specimen (and similar reactions can be expected when oxygen molecules are ionized in the vicinity of the sample). While not wishing to be bound by any principle or theory it is postulated that this etching mechanism is responsible for material removal on the nanotubes. This mechanism is fundamentally different from previously reported electron beam irradiation damage of nanotubes as seen in a TEM, where incident electrons eject carbon atoms from the nanotube and must have an incident energy of at least 86 keV[10] in order to exceed the carbon-carbon bonding strength.

The present invention contemplates that bundles of nanotubes would consistently be cut faster than individual nanotubes, despite the greater amount of material that must be removed. Theoretical calculations of water adsorption on the outside of nanotube bundles have shown that water molecules will be adsorbed first into the groove between two nanotubes and only at higher densities will they then be adsorbed onto the entire nanotube surface[11]. This suggests that bundles will adsorb more water at a given pressure than individual nanotubes. Since the presence of water greatly accelerates cutting, the present invention contemplates that nanotube bundles can be expected to be easier to cut than individual nanotubes.

Two-contact electrical transport shows a steady increase in the resistance of the nanotube during the cut, with no steps or jumps showing opening or closing of discrete conductance channels. The present invention contemplates that by passing current through the nanotube during a cut could reduce the damage done to the nanotube and greatly increase its lifetime under the beam. For example, placing a potential of 1.7V across a nanotube with an initial resistance of 15 k$\Omega$ would effect the heating of the nanotube, and decrease the cutting rate by a factor of 4 (this heated cut took 20 minutes, while two separate unheated cuts on the same nanotube with no voltage applied took 5 minutes each).

It is believed that resistively heating the nanotube may reduce the nanodevice material removal through two possible mechanisms. It has been shown that raising the temperature of nanotubes to over 300° C. reduces knock-on damage by annealing out defects via an increased mobility of interstitial atoms[12]. Also, by increasing the temperature of the nanotube the sticking coefficient of water molecules impinging on the surface is decreased, thus limiting the number of assist gas species present to reactively aid in cutting.

Thus, it is further believed that at a constant electron beam scan current, the rate of cutting can be independently controlled by varying the temperature of a nanodevice from below room temperature, to room temperature, to 300° C.; at lower temperatures, material removal is increased, while at higher temperature, material removal is decreased.

It is interesting that at temperatures of around 300° C. and higher, it appears that unintentional collateral damage (to a carbon-based nanodevice during low voltage material removal with an assist gas) is annealed both during material removal and afterwards. It is thought that this process is due to the higher mobility of interstitial atoms at these temperatures; essentially, they are able to move and fill damaged sites in the atomic lattice.

Figure 3:
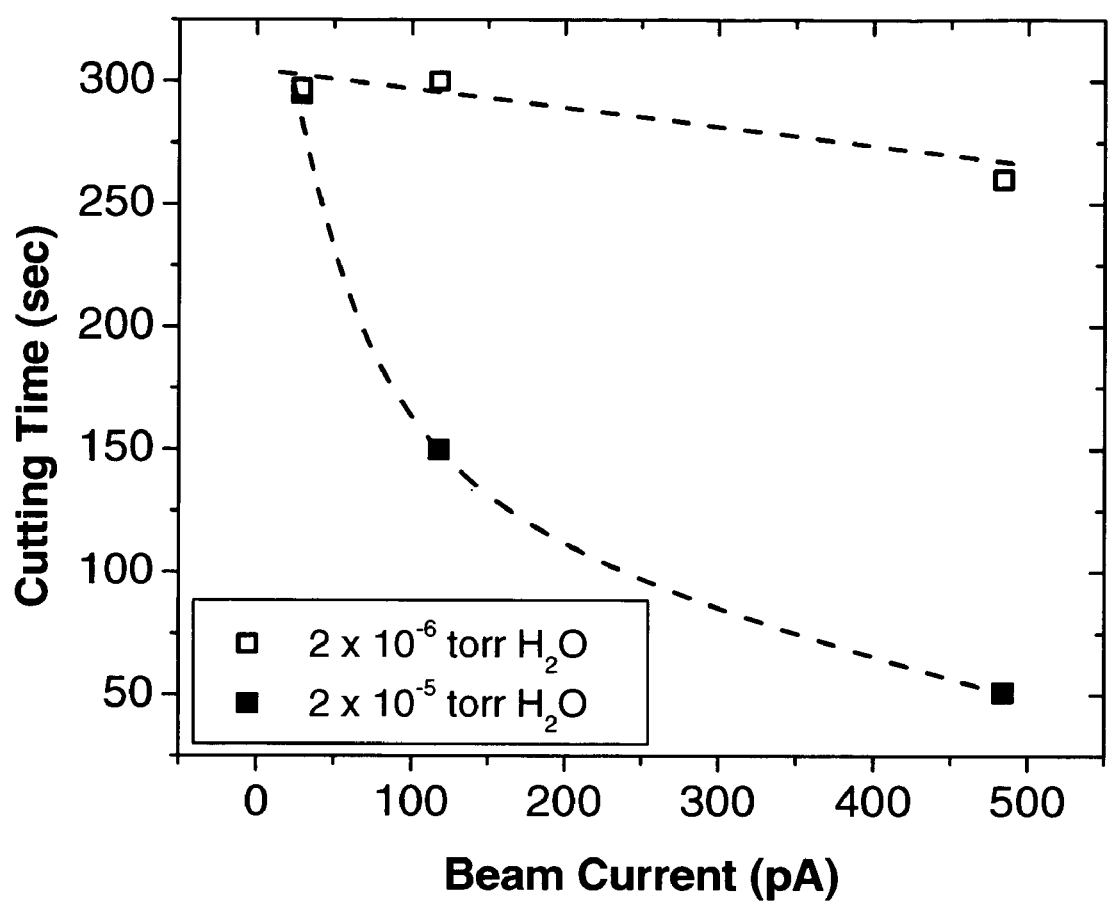
FIG. 3 is a graph of cutting times for multiple cuts on two nanotubes in different atmospheres at different beam currents. In both cases the majority gas was water vapor. The dashed lines are guides for the eye.

FIG. 3 shows the results of cutting two nanotubes exposed to different partial pressures of water at various beam currents. At a higher partial pressure, increasing the beam current speeds up the cutting process. This appears to be a consequence of adding more energy to the system, thus increasing the rate of the chemical reactions active in removing material. At low water vapor pressure ($2 \cdot 10^{-6}$ Torr), however, the material removal effect was greatly suppressed, and even high beam currents (~500 pA) were found to not significantly increase cutting speed. The present invention contemplates that at low pressures, the material removal rate is more limited by the number density of water present, rather than the amount of energy supplied by the electron beam.

For carbon-based nanodevices, a maximum nanodevice temperature for the carbon components would typically be about 2700° K, at which point the carbon vaporizes. At the much lower temperature of about 600° K, however, carbon would react with water vapor to form carbon monoxide, CO.

Figures 4A, 4B:
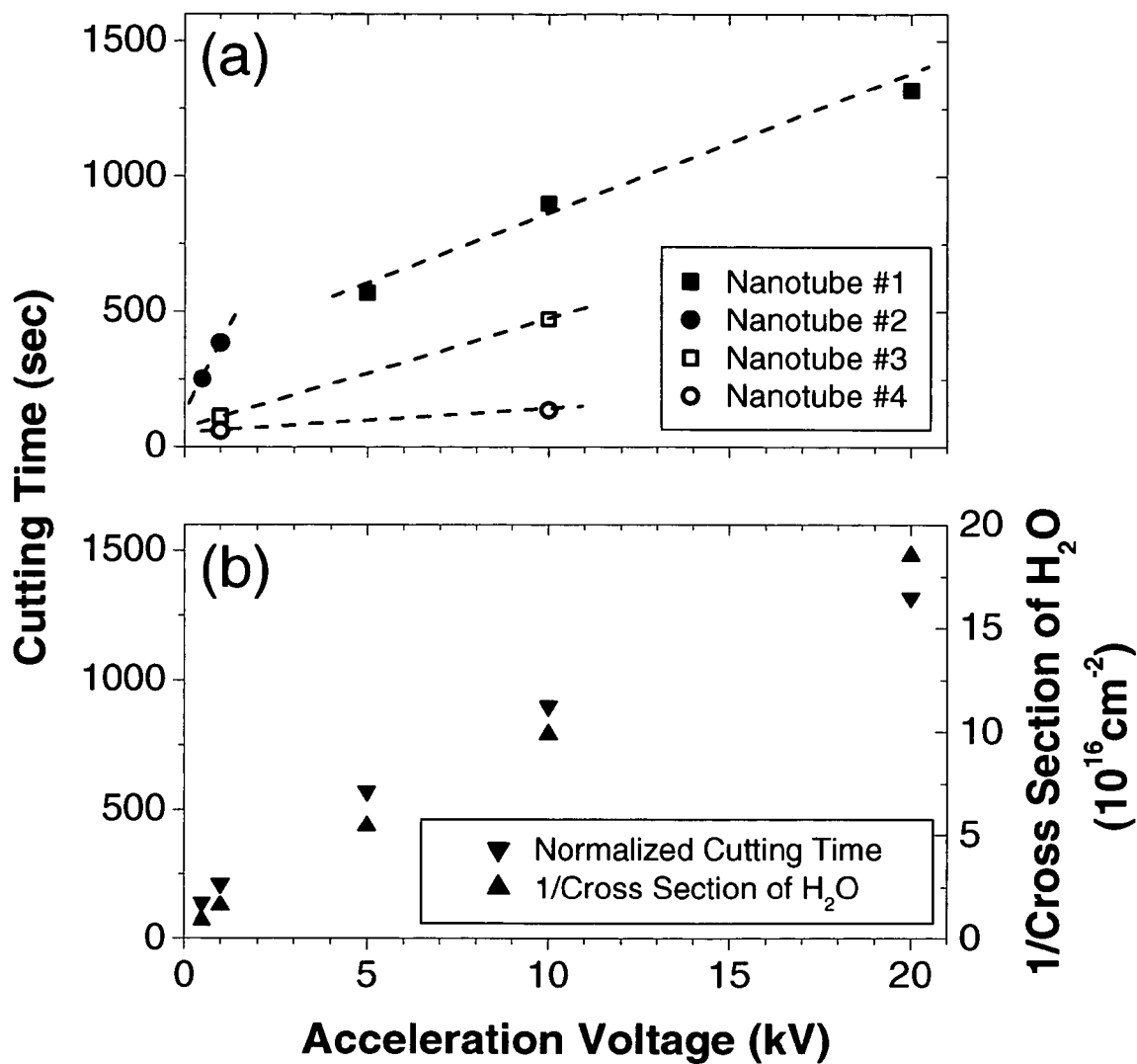
FIG. 4A is a graph of cutting time vs. acceleration voltage that shows cutting times for multiple cuts on several nanotubes at different electron beam energies. The dashed lines are guides for the eye.
FIG. 4B is a graph of graphs of cutting time vs. acceleration voltage that shows normalized cutting data from three nanotubes at different electron beam energies. The inverse of the total ionization cross section for water molecules as a function of electron energy is also plotted, and follows the same trend.

FIG. 4A shows cutting times for multiple cuts on several nanotubes at different acceleration voltages. Contrary to naïve expectation, increasing the acceleration voltage of the electron beam increases the cutting time. This effect is due to the cross section for the ionization of a water molecule decreasing as the incoming electrons become more energetic. Schutten et al[13] have measured the total ionization cross section for water for this range of electron energies. A normalized plot made by rescaling the cutting times of different nanotubes to match at common acceleration voltages is shown in FIG. 4B, together with a plot of the inverse of the total ionization cross section.

The present invention contemplates careful minimization of the beam exposure while locating and imaging the nanotubes prior to cutting. From the results presented here, it is evident that precautions must be taken during all SEM/nanotube experiments to limit beam-induced damage. The present invention contemplates the ability to modify the shape and cut inorganic nanostructures (boron-nitride nanotubes), extending this caveat to SEM work on all sensitive nanomaterials.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

CONCLUSION

All patents, patent applications, and publications mentioned above are herein incorporated by reference in their entirety for all purposes. None of the patents, patent applications, and publications mentioned above are admitted to be prior art.

REFERENCES

[1] S. Iijima, Nature 354, 56 (1991)

[2] N. G. Chopra, R. J. Luyken, K. Cherrey, V. H. Crespi, M. L. Cohen, S. G. Louie, and A. Zettl, Science 269, 966 (1995).

[3] H. Dai, J. H. Hafner, A. G. Rinzler, D. T. Colbert, and R. E. Smalley, Nature 384, 147 (1996).

[4] A. M. Fennimore, T. D. Yuzvinsky, W. Q. Han, M. S. Fuhrer, J. Cumings, and A. Zettl, Nature 424, 408 (2003).

[5] T. D. Yuzvinsky, A. M. Fennimore, and A. Zettl in *Electronic Properties of Synthetic Nanostructures*, AIP Conf. Proc. 723, 512 (2004).

[6] S. C. Tsang, Y. K. Chen, P. J. F. Harris, and M. L. H. Green, Nature 372, 159 (1994)

[7] J. Cumings, P. G. Collins, and A. Zettl, Nature 406, 586 (2000)

[8] J. Li and F. Banhart, Nano Letters 4, 1143 (2004).

[9] A. Rubio, S. P. Apell, L. C. Venema, and C. Dekker, Eur. Phys. J. B 17, 301 (2000).

[10] J-Y Park, Y. Yaish, M. Brink, S. Rosenblatt, and P. L. McEuen, Appl. Phys. Lett. 80, 4446 (2002).

[11] P. G. Collins, M. S. Arnold, and Ph. Avouris, Science 292, 706 (2001).

[12] J. I. Goldstein, D. E. Newbury, P. Echlin, D. C. Joy, A. D. Romig, Jr., C. E. Lyman, C. Fiori, E. Lifshin, *Scanning Electron Microscopy and X-Ray Microanalysis* (Plenum Press, New York, 1992), pp. 571-670.

[13] H. G. Heide, Lab. Invest., 14, 1135 (1965).

[14] D. C. Joy, C. S. Joy, and D. A. Armstrong in *Electron Probe Microanalysis: Applications in Biology and Medicine*, edited by K. Zierold and H. K. Hagler (Springer, Berlin, Del., 1989), pp 127-136.

[15] Y. Talmon, H. T. Davis, L. E. Scriven, and E. L. Thomas, J. Microscopy 117, 321 (1979).

[16] B. W. Smith and D. E. Luzzi, J. Appl. Phys. 90, 3509 (2001).

[17] J. Marti and M. C. Gordillo, J. Chem. Phys. 119, 12540 (2003).

[18] F. Banhart, T. Füller, Ph. Redlich, and P. M. Ajayan, Chem. Phys. Lett. 269, 349 (1997).

[19] J. Schutten, F. J. de Heer, H. R. Moustafa, A. J. H. Boerboom, and J. Kistemaker, J. Chem. Phys. 44, 3924 (1966).

What is claimed is:

1. A method of shape modifying a nanodevice, comprising:
   a) providing a nanodevice;
   b) providing an assist gas;
   c) contacting the nanodevice with a low energy focused electron beam in a presence of the assist gas; and
   d) applying a force to at least a part of the nanodevice during application of the low-energy focused electron beam, whereby the nanodevice is transformed into a shape-modified nanodevice.

2. The method of shape-modifying a nanodevice of claim 1, wherein force of said applying the force comprises a particular force selected from the group consisting of, a gravity induced force, an electromagnetically induced force, a ponderomotive force, a mechanically induced force or torque, and a laser tweezers force.

3. The method of shape modifying a nanodevice of claim 1, wherein the low-energy focused electron beam of said contacting the nanodevice is a scan beam of a scanning electron microscope.

4. The method of shape modifying a nanodevice of claim 1, further comprising observing the nanodevice during said contacting of the nanodevice with the low-energy focused electron beam.

5. The method of shape modifying a nanodevice of claim 1, wherein the nanodevice comprises a carbon-based nanodevice and the assist gas comprises a particular assist gas selected from the group consisting of $O_2$, $O_3$, $H_2O$, $H_2O_2$, $N_2$, and $H_2$.

6. The method of shape modifying a nanodevice of claim 1, wherein the assist gas forms a breakdown product, in the presence of the low-energy electron beam, comprising a particular breakdown product selected from the group consisting of $Br^-$, $F^-$, $Cl^-$, $H^+$, $O^-$, $OH^-$.

7. The method of shape modifying a nanodevice of claim 1, wherein a partial pressure for the assist gas is greater than a particular partial pressure selected from the group consisting of $10^{-6}$ Torr, $10^{-5}$ Torr, $10^{-4}$ Torr, $10^{-3}$ Torr, $10^{-2}$ Torr, $10^{-1}$ Torr, 1 Torr, 10 Torr, 100 Torr, and 1000 Torr.

8. The method of shape modifying a nanodevice of claim 1 wherein the nanodevice comprises a component selected from the group consisting of:
a) a single walled carbon nanotube;
b) a multiwalled carbon nanotube;
c) a carbon nanowire;
d) a carbon nanosheet;
e) a carbon nanobelt;
f) a carbon nanotube bundle;
g) a tin dioxide nanobelt;
h) a boron-nitride nanotube;
i) a silicon nanotube;
j) a silicon nanobelt;
k) a silicon nanowire;
l) a compositionally modulated silicon nanowire; and
m) a silicon nanomembrane.

9. A method of shape modifying a nanodevice, comprising:
a) providing an initial nanodevice;
b) applying a low-energy focused electron beam to the initial nanodevice; and;
c) applying a force to at least a part of the initial nanodevice during application of the low-energy focused electron beam, whereby the initial nanodevice is transformed into a shape-modified nanodevice.

10. The method of shape-modifying a nanodevice of claim 9, wherein the force of said applying the force comprises a particular force selected from the group consisting of a gravity induced force, an electromagnetically induced force, a ponderomotive force, a mechanically induced force or torque, and a laser tweezers forces.

11. The method of shape-modifying a nanodevice of claim 9, further comprising providing an assist gas and contacting the initial nanodevice with the low-energy focused electron beam in the presence of the assist gas, whereby material from the initial nanodevice is selectively removed.

12. The method of shape-modifying a nano device of claim 1, wherein the nanodevice comprises a silicon-based nanodevice and the assist gas comprises a particular assist gas selected from the group consisting of $H_2$, $CH_4$, $F_2$, $NF_3$, $SiF_4$, $CF_4$, $SF_6$, $Cl_2$, $Br_2$, and $CBr_4$.

13. A method of shape-modifying a nanodevice comprising:
contacting a nano-dimensioned component of the nanodevice with a focused electron beam, the focused electron beam having an electron energy less than a minimum energy needed to completely dislodge an atom from the nano-dimensioned component without a presence of an assist gas; and
applying a force to the nano-dimensioned component during said contacting the nano-dimensioned component with the focused electron beam which transforms the nano-dimensioned component into a shape-modified nano-dimensioned component.

14. The method of shape-modifying the nanodevice of claim 13, wherein the force comprises a particular force selected from the group consisting of a gravity induced force, an electromagnetically induced force, a ponderomotive force, a mechanically induced force, and a laser tweezers force.

15. The method of shape-modifying the nanodevice of claim 13, further comprising providing a assist gas in a vicinity of the nano-dimensioned component during said contacting the nano-dimensioned component with the focused electron beam which causes selective removal of material from the nano-dimensioned component.

16. The method of shape-modifying the nanodevice of claim 13, wherein the nano-dimensioned component is selected from the group consisting of a nanotube, a nanowire, a nanosheet, a nanobelt, a nanotube bundle, and a nanomembrane.

17. The method of shape-modifying the nanodevice of claim 13, wherein the nano-dimensioned component comprises a material selected from the group consisting of carbon, tin dioxide, boron nitride, and silicon.

* * * * *